(12) United States Patent
Yanagimachi et al.

(10) Patent No.: US 10,036,100 B2
(45) Date of Patent: Jul. 31, 2018

(54) APPARATUS FOR PRODUCING SILICON SINGLE CRYSTAL

(71) Applicant: SHIN-ETSU HANDOTAI CO., LTD., Tokyo (JP)

(72) Inventors: Takahiro Yanagimachi, Nishigo-mura (JP); Masahiro Akiba, Nishigo-mura (JP); Junya Tokue, Iwaki (JP); Susumu Sonokawa, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 85 days.

(21) Appl. No.: 15/112,653

(22) PCT Filed: Feb. 3, 2015

(86) PCT No.: PCT/JP2015/000453
§ 371 (c)(1),
(2) Date: Jul. 19, 2016

(87) PCT Pub. No.: WO2015/122145
PCT Pub. Date: Aug. 20, 2015

(65) Prior Publication Data
US 2016/0333496 A1    Nov. 17, 2016

(30) Foreign Application Priority Data
Feb. 12, 2014    (JP) ................. 2014-024363

(51) Int. Cl.
*C30B 15/14*    (2006.01)
*C30B 15/20*    (2006.01)
(Continued)

(52) U.S. Cl.
CPC ............ *C30B 15/203* (2013.01); *C30B 15/14* (2013.01); *C30B 15/20* (2013.01); *C30B 15/22* (2013.01); *C30B 29/06* (2013.01)

(58) Field of Classification Search
CPC ......... C30B 15/14; C30B 15/20; C30B 15/22; Y10T 117/217
See application file for complete search history.

(56) References Cited

U.S. PATENT DOCUMENTS 3,701,686 A * 10/1972 Argue et al. ............ H01M 6/16
429/199
6,110,274 A    8/2000 Okuno
(Continued)

FOREIGN PATENT DOCUMENTS

CN    1396965 A    2/2003
CN    1115427 C    7/2003
(Continued)

OTHER PUBLICATIONS

Apr. 28, 2015 International Search Report issued in International Patent Application No. PCT/JP2015/000453.
(Continued)

*Primary Examiner* — Robert M Kunemund
(74) *Attorney, Agent, or Firm* — Oliff PLC

(57) ABSTRACT

An apparatus for producing a silicon single crystal by a Czochralski method with a chamber having a heater therein to heat a raw material and to cool the chamber by a coolant, including: measuring an inlet temperature, outlet temperature, and flow rate in a passage of the coolant to cool the chamber with flowing in the chamber; calculating a removed heat quantity from the chamber based on the measured values of the inlet temperature, outlet temperature, and flow rate; controlling heater power based on the value of the removed heat quantity. This provides an apparatus which can pull a single crystal in a crystal diameter and a crystal pulling rate closer to the target values by controlling the heater power based on a removed heat quantity from the
(Continued)

chamber calculated by the measured values of temperatures and a flow rate of the coolant.

5 Claims, 7 Drawing Sheets

(51) Int. Cl.
 *C30B 29/06* (2006.01)
 *C30B 15/22* (2006.01)

(56) References Cited

U.S. PATENT DOCUMENTS

| | | | |
|---|---|---|---|
| 6,117,462 A * | 9/2000 | Ensley | A01G 7/06 |
| | | | 426/615 |
| 6,733,585 B2 * | 5/2004 | Inagaki | C30B 15/14 |
| | | | 117/13 |
| 2002/0043206 A1 | 4/2002 | Mutti et al. | |
| 2008/0184928 A1 | 8/2008 | Hoshi et al. | |
| 2009/0249995 A1 | 10/2009 | Takano et al. | |
| 2010/0031869 A1 | 2/2010 | Iida et al. | |
| 2010/0128253 A1 | 5/2010 | Yanagimachi et al. | |
| 2013/0020311 A1 | 1/2013 | Sakagami et al. | |
| 2014/0053771 A1 * | 2/2014 | Walter | C30L 315/305 |
| | | | 117/13 |

FOREIGN PATENT DOCUMENTS

| | | |
|---|---|---|
| CN | 1844489 A | 10/2006 |
| CN | 101080515 A | 11/2007 |
| CN | 101479411 A | 7/2009 |
| CN | 101678243 A | 3/2010 |
| CN | 101772595 A | 7/2010 |
| CN | 202099412 U | 1/2012 |
| CN | 102668034 A | 9/2012 |
| JP | H11-21120 A | 1/1999 |
| JP | 2008-105873 A | 5/2008 |
| JP | 2008-127216 A | 6/2008 |
| TW | 200833880 A | 8/2008 |

OTHER PUBLICATIONS

Dec. 5, 2017 Office Action and Search Report issued in Chinese Application No. 201580008300.7.

* cited by examiner

APPARATUS FOR PRODUCING SILICON SINGLE CRYSTAL

TECHNICAL FIELD

The present invention relates to an apparatus for producing a silicon single crystal based on a Czochralski method (hereinafter referred to as CZ method), particularly an art to precisely set a heater power value in pulling a crystal.

BACKGROUND ART

Recently, in production of a defect-free crystal of a silicon single crystal, it comes to be essential to pull a crystal in a crystal diameter and a crystal pulling rate just as they are targeted. In the conventional diameter control of a silicon single crystal, crystal pulling is carried out by setting a base value of heater power on the basis of result data of heater power values in the previous crystal pulling, and by raising the heater power value relative to the set heater power value when the crystal diameter in the crystal pulling is thicker than the target or the crystal pulling rate is faster than the target, or reducing the heater power value in the opposite case, thereby controlling the heater power value.

In these conventional diameter control, however, the heater power is altered after the crystal diameter is varied from the target value or after the crystal pulling rate is varied from the target value. Accordingly, it wastes long period of time to change the temperature of the interface of the crystal growth, this time takes 30 minutes or more particularly in a large-diameter crystal, thereby having a problem of being too late to give feedback to heater power from a crystal diameter or a crystal pulling rate.

Moreover, a removed heat quantity from the chamber varies due to the depth of raw material melt in a quartz crucible, the length of a growing crystal, a positional relationship of each graphite material in a chamber, and an adhesion situation of oxide on the surface of a chamber of a single crystal producing apparatus, and the optimum value of heater power also varies thereby. Accordingly, it has been difficult to set the optimum value of heater power on the basis of result data of previous crystal pulling.

As an art to control a diameter on the basis of data other than the crystal diameter or the crystal pulling rate, Patent Document 1 and Patent Document 2 disclose arts in which a crystal pulling rate is given feedback on a removed heat quantity from a chamber by cooling water. These arts, however, have a problem of being difficult to pull a single crystal in a target pulling rate or a target crystal diameter when the heater power value is deviated from the optimum value.

CITATION LIST

Patent Literature

Patent Document 1: Japanese Unexamined Patent publication (Kokai) No. 2008-127216
Patent Document 2: Japanese Unexamined Patent publication (Kokai) No. 2008-105873

SUMMARY OF INVENTION

Technical Problem

The present invention was accomplished to solve the above-described problems. It is an object of the present invention to provide an apparatus for producing a silicon single crystal which can pull a single crystal in a crystal diameter and a pulling rate closer to the target values by controlling the heater power on the basis of a removed heat quantity from the chamber calculated from the measured values of temperatures and a flow rate of the coolant.

Solution to Problem

To solve the foregoing problems, the present invention provides an apparatus for producing a silicon single crystal based on a CZ method provided with a chamber having a heater therein to heat a raw material and cooling means to cool the chamber by a coolant, the apparatus comprising:

measuring means for measuring an inlet temperature, an outlet temperature, and a flow rate in a passage of the coolant to cool the chamber with flowing in the chamber;

calculating means for calculating a removed heat quantity from the chamber on the basis of the measured values of the inlet temperature, the outlet temperature, and the flow rate; and heater power-controlling means for controlling heater power on the basis of the calculated value of the removed heat quantity.

Such an apparatus for producing a silicon single crystal can pull a single crystal in a crystal diameter and a crystal pulling rate closer to the target values by controlling the heater power on the basis of a removed heat quantity from the chamber calculated from the measured values of temperatures and a flow rate of the coolant.

The apparatus for producing a silicon single crystal preferably has measuring means for measuring a crystal diameter in a straight body forming process, and calculating means for calculating a correction value of the heater power on the basis of the measured value of the crystal diameter.

Having such means, it is possible to control the heater power with considering the measured value of a crystal diameter too, not only a removed heat quantity.

The heater power-controlling means preferably has a function for calculating a pattern of set values of heater power in a straight body forming process in the next pulling, on the basis of operation result data of the removed heat quantity from the chamber obtained through pulling a silicon single crystal.

Having such a function, it is possible to set the pattern of heater power in the next pulling on the basis of data obtained through pulling a silicon single crystal.

In this case, the pattern of set values of heater power in a straight body forming process in the next pulling can be calculated such that the set value of the heater power is a power value equivalent to the calculated value of the removed heat quantity.

In this case, the pattern of set values of heater power in a straight body forming process in the next pulling can be calculated such that the set values of heater power is given feedback on pattern correction value "W" of heater power determined by the following equation:

$$W = W^s - (H^a - H^b)$$

wherein, "W" represents the pattern correction value of heater power, $W^s$ represents a heater power value at the start of the straight body forming process, $H^a$ represents a removed heat quantity at the start of the straight body forming process, and $H^b$ represents the calculated value of the removed heat quantity in the straight body forming process.

This enables to calculate a pattern of set values of heater power in a straight body forming process in the next pulling from the calculated removed heat quantity.

Advantageous Effects of Invention

As described above, the inventive apparatus for producing a silicon single crystal can pull a single crystal in a crystal diameter and a crystal pulling rate closer to the target values by controlling the heater power on the basis of a removed heat quantity from the chamber calculated from the measured values of temperatures and a flow rate of the coolant in addition to a measured value of a crystal diameter. Moreover, it is possible to set heater power in the next pulling from the removed heat quantity calculated on the basis of data obtained through pulling a single crystal. Accordingly, it is also possible to obtain a single crystal with a desired quality and to improve a production yield and productivity of a single crystal.

DESCRIPTION OF EMBODIMENTS

As described above, it has been desired to develop an apparatus for producing a silicon single crystal which can pull a single crystal in a crystal diameter and a crystal pulling rate closer to the target values even when the heater power value is deviated from the optimum value.

The present inventors have diligently studied to accomplish the foregoing problems and consequently found that the value of heater power required to pull the crystal with the target diameter and the target pulling rate in a straight body forming process finally balances with a removed heat quantity at each position of a straight body from a chamber in an apparatus for producing a silicon single crystal. On the basis of this, the inventors further found that it is possible to correctly grasp whether the value of heater power for heating is adequate or not by calculating a removed heat quantity from a chamber in an apparatus for producing a silicon single crystal in a straight body forming process and by comparing the calculated removed heat quantity and a heater power value, and when the removed heat quantity and the heater power value is not balanced, it is possible to perform the crystal production in accordance with the target diameter and the target crystal pulling rate by correcting the heater power value such that the heater power value is equivalent to the removed heat quantity, thereby brought the present invention to completion.

That is, the present invention is an apparatus for producing a silicon single crystal based on a CZ method provided with a chamber having a heater therein to heat a raw material and cooling means to cool the chamber by a coolant, the apparatus comprising:

measuring means for measuring an inlet temperature, an outlet temperature, and a flow rate in a passage of the coolant to cool the chamber with flowing in the chamber;

calculating means for calculating a removed heat quantity from the chamber on the basis of the measured values of the inlet temperature, the outlet temperature, and the flow rate; and heater power-controlling means for controlling heater power on the basis of the calculated value of the removed heat quantity.

Hereinafter, the present invention will be described in detail by referring to FIGs, but the present invention is not limited thereto.

Figure 1:
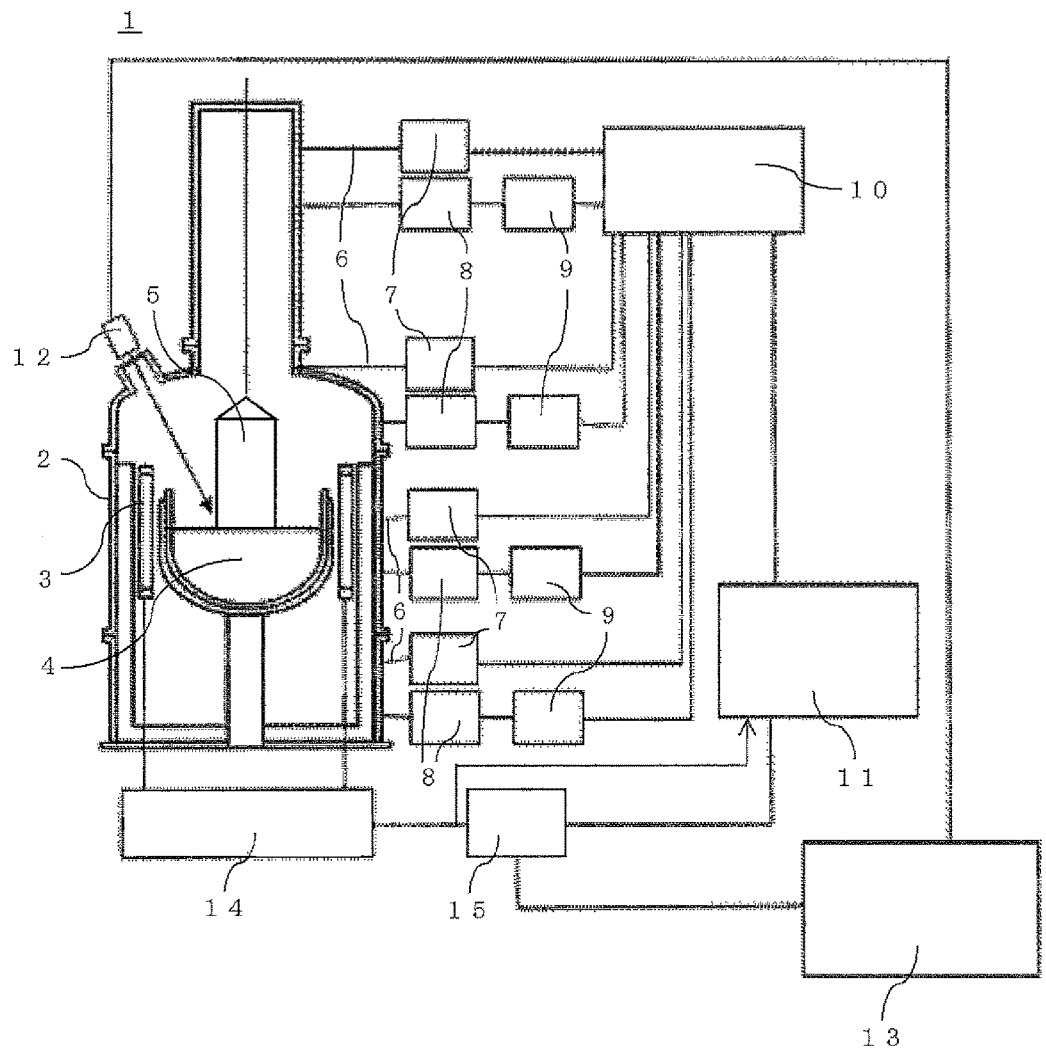
FIG. 1 is a schematic drawing to show an example of the inventive apparatus for producing a silicon single crystal.

FIG. 1 is a schematic drawing to show an example of the inventive apparatus for producing a silicon single crystal.

In the inventive apparatus for producing a silicon single crystal 1, a silicon single crystal 5 is pulled from raw material melt 4 heated by a heater 3 in a chamber 2. The chamber 2 is cooled by cooling means 6. An inlet temperature, an outlet temperature, and a flow rate in a passage for flowing a coolant for cooling are measured by inlet temperature-measuring means 7, outlet temperature-measuring means 8, and flow rate-measuring means 9, respectively. In a removed heat quantity-calculating means 10, a removed heat quantity is calculated on the basis of the measured values of the inlet temperature, the outlet temperature, and the flow rate. Furthermore, in a heater power-calculating part 11 on a removed heat quantity basis, correction values of heater power are calculated. The crystal diameter of the silicon single crystal 5 in pulling is measured by a crystal diameter-measuring means 12. On the basis of the measured values, correction values of heater power are calculated by a heater power-calculating part 13 on a crystal diameter basis. The power values of a direct-current power source 14 is controlled by a heater power-output part 15 on the basis of these correction values, thereby controlling an output of the heater 3.

Figure 2:
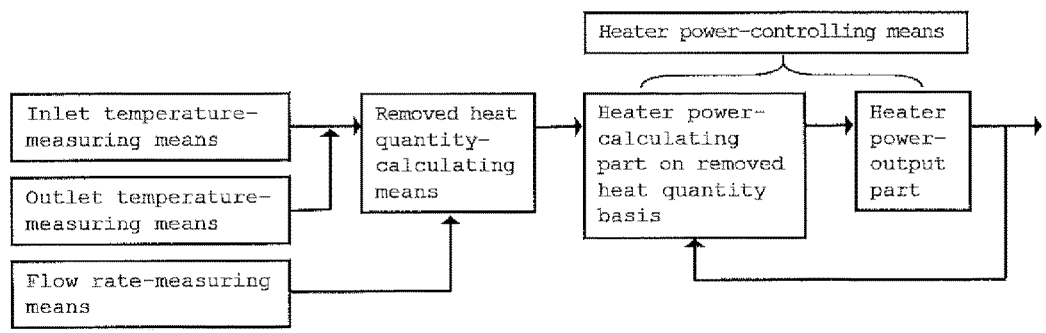
FIG. 2 is a flow chart to show a flow from measuring means for measuring an inlet temperature, an outlet temperature, and a flow rate to heater power-controlling means.

FIG. 2 is a flow chart to show a flow from measuring means for measuring an inlet temperature, an outlet temperature, and a flow rate to heater power-controlling means. As shown in FIG. 2, in the inventive apparatus for producing a silicon single crystal, the inlet temperature, the outlet temperature, and the flow rate are measured by each measuring means; the removed heat quantity from a chamber is calculated from the measured values by the removed heat quantity-calculating means; the correction values of heater power are calculated on the basis of the calculated removed heat quantity by the heater power-calculating parts; and the heater power is controlled by the heater power-output part. Incidentally, in the present invention, the heater power-calculating part and the heater power-output part are referred to as heater power-controlling means in a mass.

Means for Measuring Inlet Temperature, Outlet Temperature, and Flow Rate

The chamber 2 is divided in order to open and close, and each divided chamber is provided with the cooling means 6. Accordingly, the inlet temperature, the outlet temperature, and the flow rate in a passage of the coolant are measured for each passage of the divided chambers.

As the measuring means of the inlet temperature and the outlet temperature in a passage of the coolant, although it is not particularly limited, a thermocouple, a resistance temperature sensor, and so on are mentioned, for example.

As the measuring means of the flow rate, although it is not particularly limited, an electromagnetic flowmeter, a vortex flowmeter, a Coriolis-type mass flowmeter, an ultrasonic flowmeter, and so on are mentioned, for example.

Removed Heat Quantity-Calculating Means

Then, the removed heat quantity from the chamber is calculated on the basis of the measured values of the inlet temperature, the outlet temperature, and the flow rate. In the present invention, the removed heat quantity from the chamber "H" is defined by the following equation:

$$H = \Delta T \times L \times C \times \rho$$

$$\Delta T = T_{out} - T_{in}$$

wherein, "H" represents a removed heat quantity (kW), $T_{out}$ represents an outlet temperature of the coolant (K), $T_{in}$ represents an inlet temperature of the coolant (K), "L" represents a flow rate of the coolant (L/sec); "C" represents specific heat of the coolant (kJ/kg·K), and C=4.1868 in water; and "ρ" represents density of the coolant (kg/L), and ρ=0.9970 in water at 25° C. and atmospheric pressure.

Heater Power-Controlling Means

Then, by the heater power-calculating means on a removed heat quantity basis, correction values of heater power are calculated on the basis of the removed heat quantity calculated as described above. The correction value is determined by the following equation:

correction value of heater power=heater power value−removed heat quantity ($H$)

The inventive apparatus for producing a silicon single crystal is preferably provided with measuring means for measuring a crystal diameter in a straight body forming process, and calculating means for calculating a correction value of the heater power on the basis of the measured value of the crystal diameter.

Having such means, the correction value of heater power on the basis of the measured value of the crystal diameter in a crystal pulling, not only a correction value of heater power on the basis of the foregoing removed heat quantity, can be calculated by the heater power-calculating means on a crystal diameter basis. By controlling the heater power using these correction values at the same time, a single crystal can be pulled in a crystal diameter and a crystal pulling rate much more closer to the target values.

Then, the heater power is actually controlled by the heater power-output part on the basis of the correction values calculated as described above.

As described above, the inventive apparatus for producing a silicon single crystal can pull a single crystal in a crystal diameter and a crystal pulling rate closer to the target values by controlling the heater power on the basis of a removed heat quantity from the chamber calculated from the measured values of temperatures and a flow rate of the coolant in addition to a measured value of a crystal diameter.

In the inventive apparatus for producing a silicon single crystal, the foregoing heater power-controlling means is preferably provided with a function for calculating a pattern of set values of heater power in a straight body forming process in the next pulling, on the basis of operation result data of the removed heat quantity from the chamber obtained through pulling a silicon single crystal.

Figure 3:
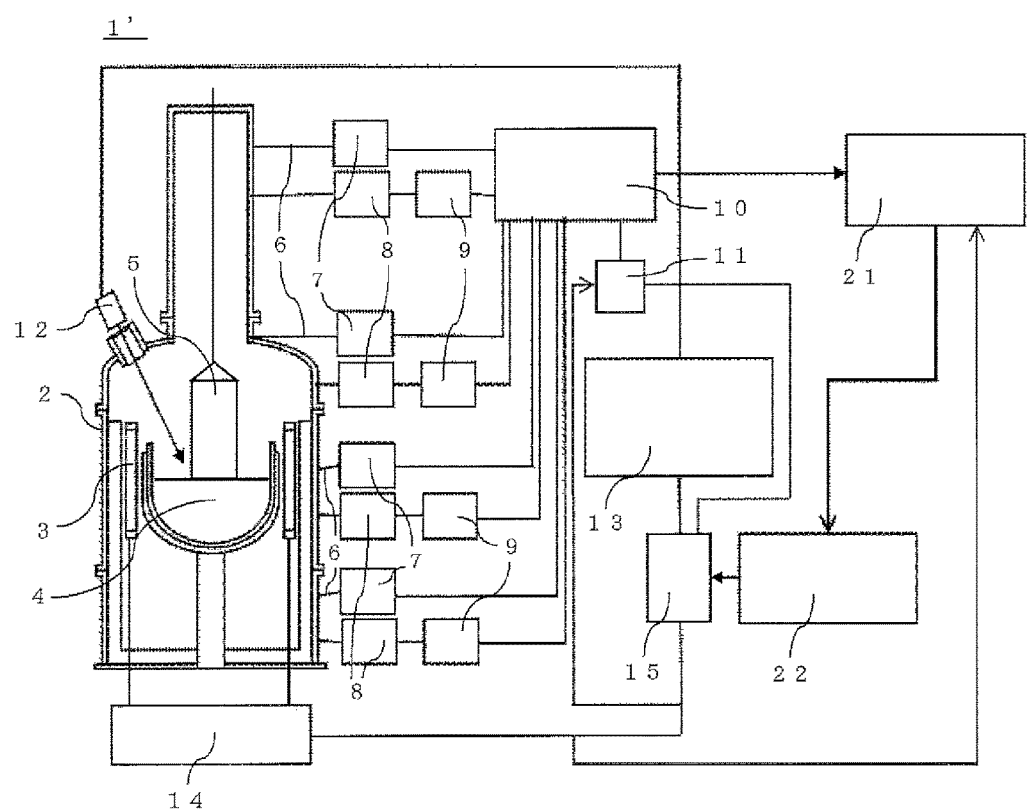
FIG. 3 is a schematic drawing to show an example of the inventive apparatus for producing a silicon single crystal provided with a function for calculating a pattern of set values of heater power.

Shown in FIG. 3 is an example of an apparatus for producing a silicon single crystal provided with such a function.

In the inventive apparatus for producing a silicon single crystal 1', a silicon single crystal 5 is pulled as in the foregoing apparatus for producing a silicon single crystal shown in FIG. 1. The data of removed heat quantity obtained through pulling a single crystal are collected into an operation result data base 21. On the basis of these data, a pattern of set values of heater power in a straight body forming process in the next pulling (hereinafter, also referred to as a set power pattern) is calculated by a pattern calculating part 22 on a removed heat quantity basis.

In this case, the set power pattern can be calculated such that the set value of the heater power is a power value equivalent to the calculated value of the removed heat quantity or calculated such that the set values of heater power is given feedback on pattern correction value "W" of heater power determined by the following equation:

$$W = W^s - (H^a - H^b)$$

wherein, "W" represents the pattern correction value of heater power, $W^s$ represents a heater power value at the start of the straight body forming process, $H^a$ represents a removed heat quantity at the start of the straight body forming process, and $H^b$ represents the calculated value of the removed heat quantity in the straight body forming process.

Figure 4:
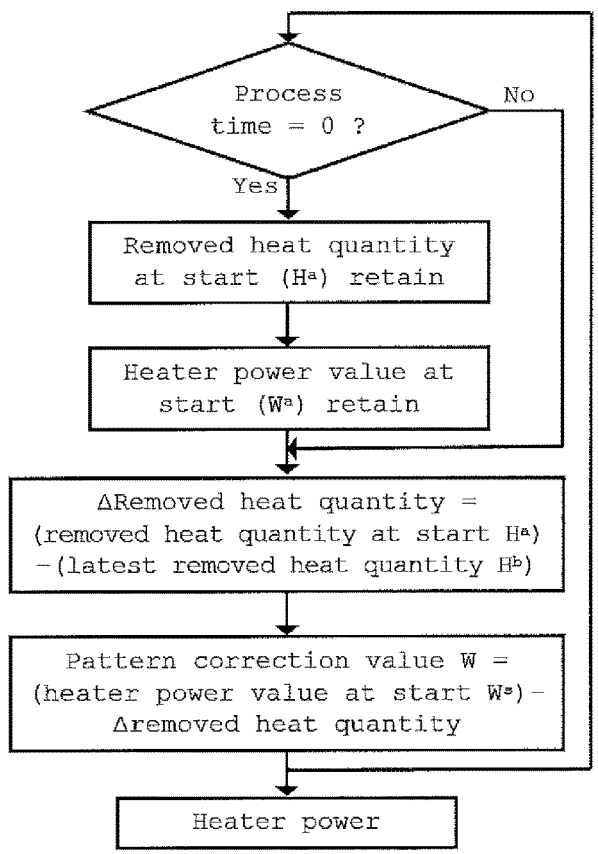
FIG. 4 is a flow chart to show an example of a flow for calculating heater power.

Shown in FIG. 4 is an example of a heater power-calculating flow in calculating a set power pattern.

In the calculation and the feedback of the pattern correction value "W", it is possible to determine the pattern correction value "W" at each straight body position to calculate a set power pattern in accordance with the flow shown in FIG. 4.

Having such a function for calculating the set power pattern, it is possible to set heater power in the next pulling on the basis of data obtained through pulling a single crystal.

As described above, the inventive apparatus for producing a silicon single crystal can pull a single crystal in a crystal diameter and a crystal pulling rate closer to the target values by controlling the heater power on the basis of a removed heat quantity from the chamber calculated from the measured values of temperatures and a flow rate of the coolant in addition to a measured value of a crystal diameter. It is also possible to set heater power in the next pulling from the removed heat quantity calculated on the basis of the data obtained through pulling a single crystal. Accordingly, a single crystal with a desired quality can be obtained, and the production yield and the productivity of a single crystal can be improved.

EXAMPLE

Hereinafter, the present invention will be specifically described with reference to Examples and Comparative Examples, but the present invention is not limited thereto.

Example

Figure 5:
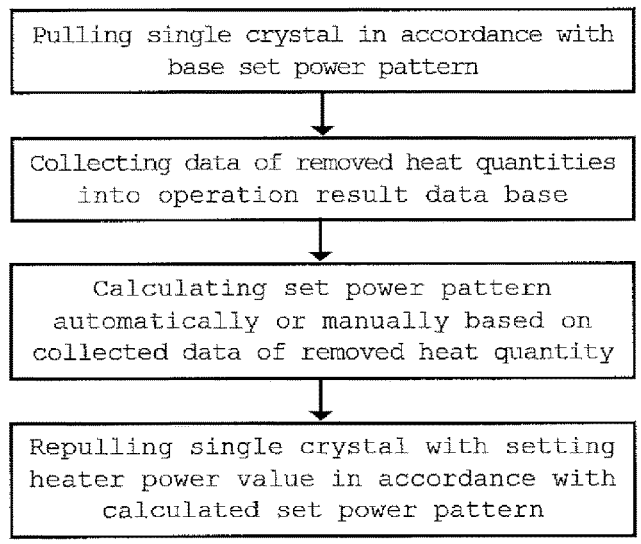
FIG. 5 is a flow chart to show a process in Example.

By using the inventive apparatus for producing a silicon single crystal shown in FIG. 3, a silicon single crystal with a diameter of 300 mm and a length of the straight body part of 1800 mm was pulled in accordance with the flow shown in FIG. 5.

Figure 6:
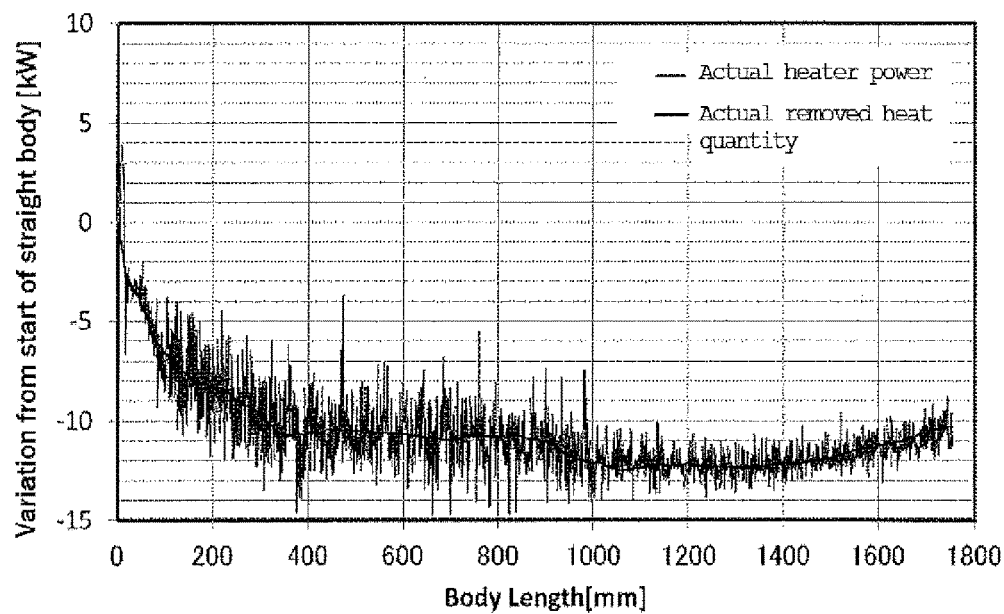
FIG. 6 is a graph to show actual heater power values and actual removed heat quantities in Example.

At first, the first pulling of a single crystal was carried out in accordance with a base set power pattern calculated on the basis of result data of heater power values in the previous crystal pulling, and the data of removed heat quantities were collected into an operation result data base. Shown in FIG. 6 are the data of actual heater power values and the actual removed heat quantities in the first pulling. As shown in FIG. 6, the both values of the actual heater power values and the actual removed heat quantities almost coincided with each other.

Subsequently, the set power pattern in FIG. 7 was calculated on the basis of the collected data of removed heat quantities. It is to be noted that the set power pattern was calculated such that the set value of the heater power is a power value equivalent to the calculated removed heat quantity. Herein, a base set power pattern and the calculated set power pattern (FIG. 7) were compared and shown in FIG. 8.

Figure 7:
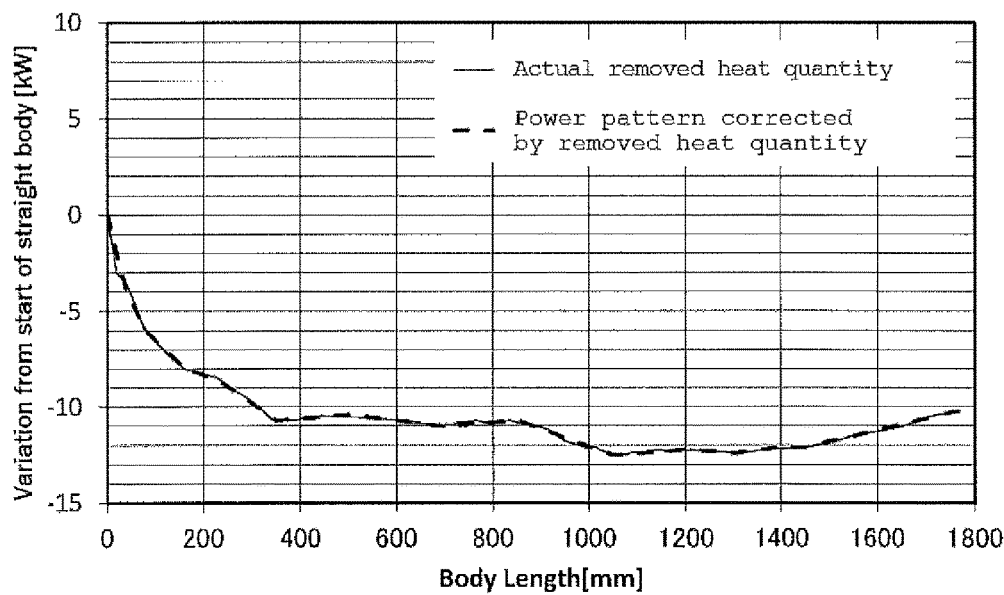
FIG. 7 is a graph to show actual removed heat quantities and a set power pattern corrected by the removed heat quantities in Example.
Figure 8:
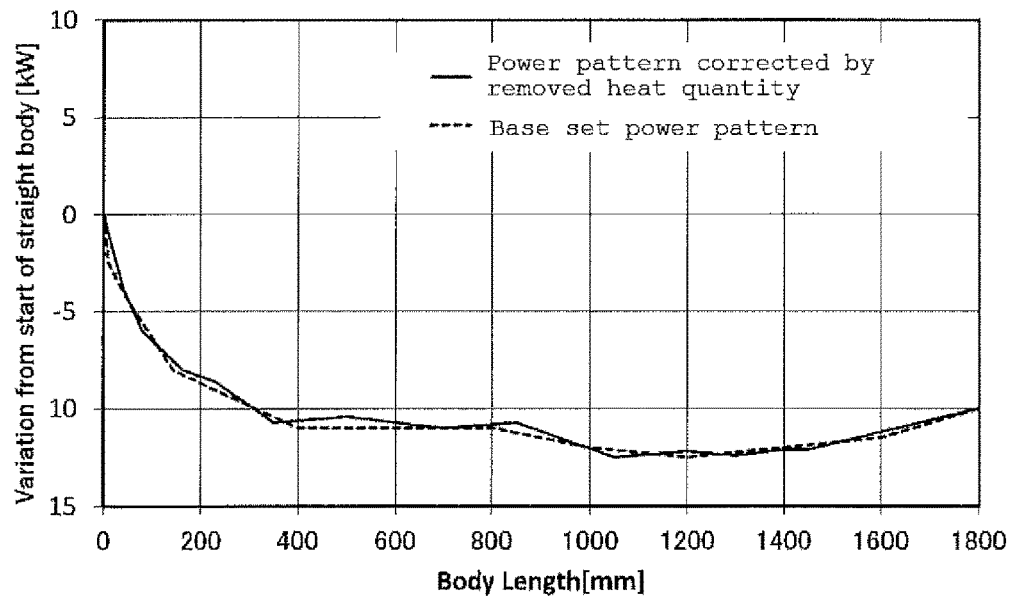
FIG. 8 is a graph to compare a base set power pattern and a set power pattern corrected by the removed heat quantities in Example.

Then, the heater power values were set in accordance with a pattern in FIG. 7 to repull a silicon single crystal with a diameter of 300 mm and a length of the straight body part of 1800 mm. It is to be noted that the control of the heater power in the crystal pulling was carried out by considering correction values of heater power determined on the basis of the removed heat quantity calculated from the temperatures and the flow rates of a coolant, in addition to conventional control, in which correction values of the heater power were calculated on the basis of a measured value of a crystal diameter in pulling.

Figure 9:
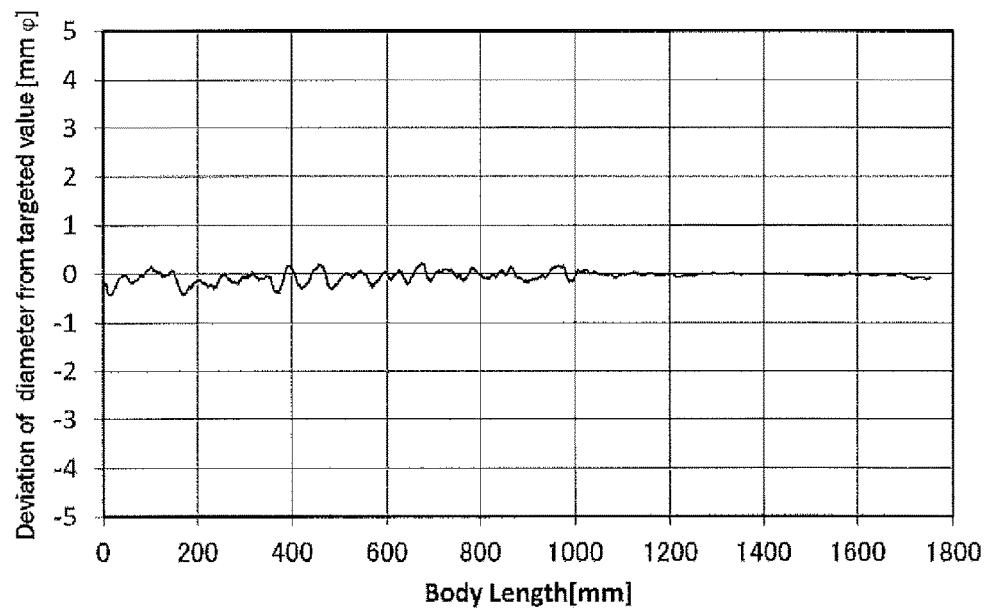
FIG. 9 is a graph to show variation of a crystal diameter in Example.

On the obtained single crystal, the diameter at each straight body position were measured and expressed as a graph of variation in the diameter, which are shown in FIG. 9.

Comparative Example

Figure 10:
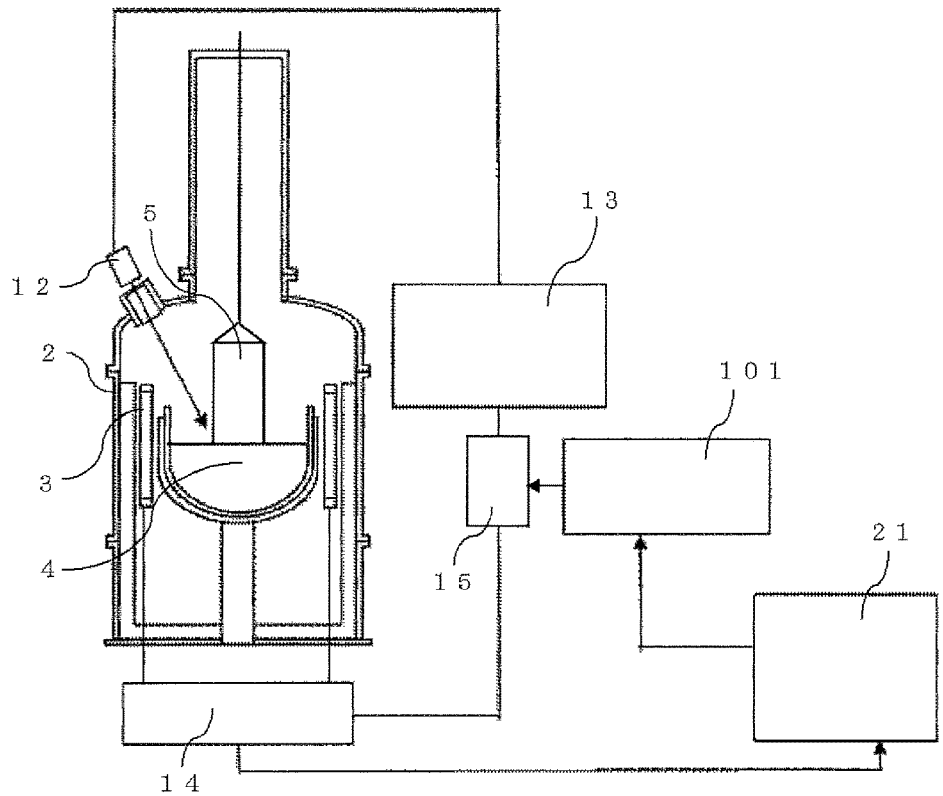
FIG. 10 is a schematic drawing to show a conventional apparatus for producing a silicon single crystal used in Comparative Example.
Figure 11:
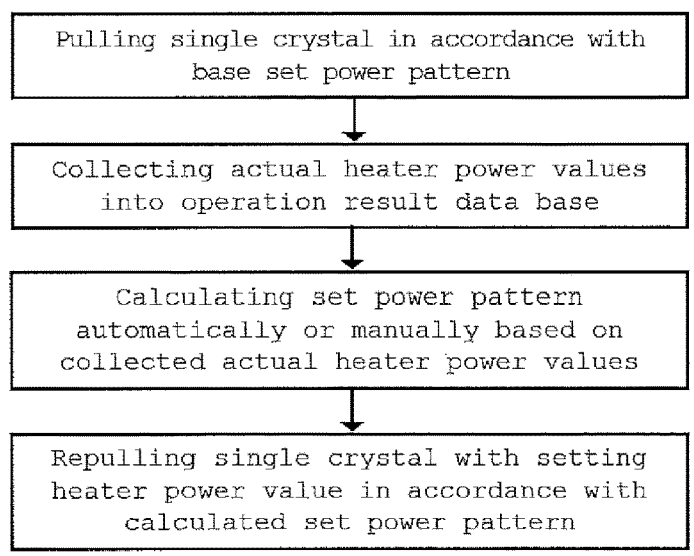
FIG. 11 is a flow chart to show a process in Comparative Example.

By using the conventional apparatus for producing a silicon single crystal 100 shown in FIG. 10, a silicon single crystal with a diameter of 300 mm and a length of the straight body part of 1800 mm was pulled in accordance with the flow shown in FIG. 11.

Figure 12:
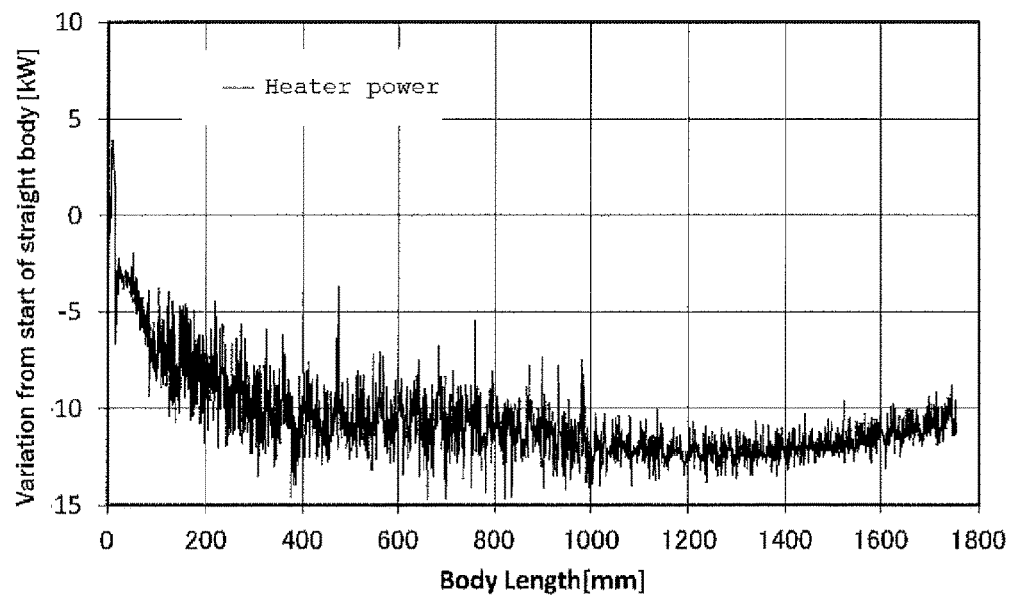
FIG. 12 is a graph to show actual heater power values in Comparative Example.

At first, the first pulling of a single crystal was carried out in accordance with a base set power pattern in the same way as in Example, and the data of actual heater power values were collected into an operation result data base 21. The actual heater power values in the first pulling are shown in FIG. 12. Subsequently, on the basis of the actual heater power values shown in FIG. 12, a set power pattern was calculated by the pattern calculating part 101 on a heater power basis.

Then, the heater power values were set in accordance with the calculated pattern to repull a silicon single crystal with a diameter of 300 mm and a length of the straight body part of 1800 mm. It is to be noted that the control of the heater power in the crystal pulling was carried out by the conventional control, in which correction values of heater power were calculated on the basis of the crystal diameter in the pulling measured by the crystal diameter-measuring means 12, using the heater power-calculating part 13 on a crystal diameter basis.

Figure 13:
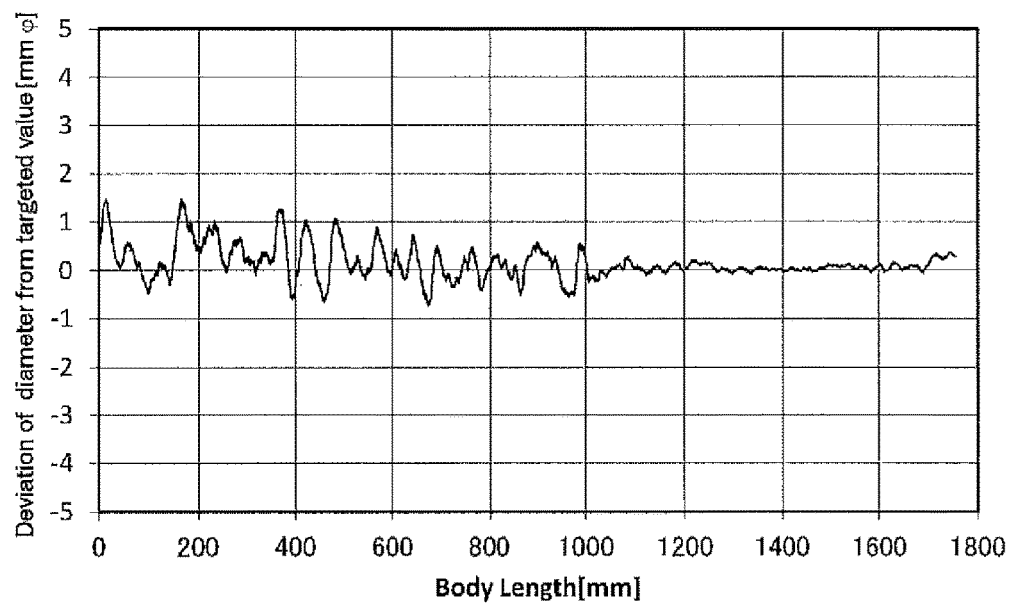
FIG. 13 is a graph to show variation of a crystal diameter in Comparative Example.

On the obtained single crystal, the diameter at each straight body position were measured and expressed as a graph of variation in the diameter, which are shown in FIG. 13.

As shown in FIG. 9 and FIG. 13, the variation of a crystal diameter from the target diameter was suppressed in Example (FIG. 9), in which a single crystal was pulled in accordance with the set power pattern calculated on the basis of the removed heat quantities, and the heater power values in the pulling were corrected on the basis of the removed heat quantities by using the inventive apparatus for producing a silicon single crystal, compared to Comparative Example (FIG. 13), in which a single crystal was pulled by using a conventional apparatus for producing a silicon single crystal without calculating a set power pattern on the basis of the removed heat quantity or correcting the power values in the pulling.

As described above, it has been revealed that the inventive apparatus for producing a silicon single crystal can pull a single crystal in a crystal diameter and a crystal pulling rate closer to the target values by controlling the heater power on the basis of a removed heat quantity from the chamber calculated from the measured values of temperatures and a flow rate of the coolant; and heater power in the next pulling can be set by the calculated removed heat quantity on the basis of data obtained through pulling a single crystal. Accordingly, it is possible to obtain a single crystal with a desired quality in a high production yield and high productivity.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. An apparatus for producing a silicon single crystal based on a Czochralski method provided with a chamber having a heater therein to heat a raw material and cooling means to cool the chamber by a coolant, the apparatus comprising:

measuring means for measuring an inlet temperature, an outlet temperature, and a flow rate in a passage of the coolant to cool the chamber with flowing in the chamber;

calculating means for calculating a removed heat quantity from the chamber on the basis of the measured values of the inlet temperature, the outlet temperature, and the flow rate; and heater power-controlling means for controlling heater power on the basis of the calculated value of the removed heat quantity, wherein the heater power-controlling means is provided with a function for calculating a pattern of set values of heater power in a straight body forming process in the next pulling, on the basis of operation result data of the removed heat quantity from the chamber obtained through pulling a silicon single crystal, and the pattern of set values of heater power in a straight body forming process in the next pulling is calculated such that the set values of heater power is given feedback on pattern correction value "W" of heater power determined by the following equation:

$$W=Ws-(Ha-Hb)$$

wherein, "W" represents the pattern correction value of heater power, Ws represents a heater power value at the start of the straight body forming process, Ha represents a removed heat quantity at the start of the straight body forming process, and Hb represents the calculated value of the removed heat quantity in the straight body forming process.

2. The apparatus for producing a silicon single crystal according to claim 1, further comprising measuring means for measuring a crystal diameter in a straight body forming process, and calculating means for calculating a correction value of the heater power on the basis of the measured value of the crystal diameter.

3. The apparatus for producing a silicon single crystal according to claim 1, wherein the measuring means for measuring an inlet temperature is selected from the group consisting of a thermocouple and a resistance temperature sensor.

4. The apparatus for producing a silicon single crystal according to claim 1, wherein the measuring means for measuring an outlet temperature is selected from the group consisting of a thermocouple and a resistance temperature sensor.

5. The apparatus for producing a silicon single crystal according to claim 1, wherein the measuring means for measuring a flow rate is selected from the group consisting of an electromagnetic flowmeter, a vortex flowmeter, a Coriolis mass flowmeter, and an ultrasonic flowmeter.

* * * * *